United States Patent
Lee et al.

(10) Patent No.: US 9,801,281 B2
(45) Date of Patent: Oct. 24, 2017

(54) RESISTANCE ASSEMBLY FOR MOBILE DEVICE AND MANUFACTURING METHOD THEREOF

(71) Applicant: SAMSUNG ELECTRO-MECHANICS CO., LTD., Suwon-Si, Gyeonggi-Do (KR)

(72) Inventors: Jea-Hoon Lee, Suwon (KR); Woo-Jin Choi, Yongin (KR); Young-Key Kim, Suwon (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/686,298

(22) Filed: Apr. 14, 2015

(65) Prior Publication Data
US 2015/0334840 A1 Nov. 19, 2015

(30) Foreign Application Priority Data

May 19, 2014 (KR) .......................... 10-2014-0059832

(51) Int. Cl.
*H05K 1/18* (2006.01)
*H05K 1/11* (2006.01)
(Continued)

(52) U.S. Cl.
CPC .............. *H05K 1/181* (2013.01); *H01C 1/012* (2013.01); *H01C 1/14* (2013.01); *H01C 17/006* (2013.01);
(Continued)

(58) Field of Classification Search
CPC .......... H05K 1/181; H05K 1/111; H05K 3/30; H05K 1/18; H03H 7/06
(Continued)

(56) References Cited

U.S. PATENT DOCUMENTS 4,934,048 A * 6/1990 McElheny ............ H01F 27/292
29/25.42
8,179,226 B2 * 5/2012 Ryu ....................... H01C 1/034
257/698

(Continued)

FOREIGN PATENT DOCUMENTS

CN        1325117 A     12/2001
CN        1507635 A      6/2004
CN      102013298 A      4/2011

OTHER PUBLICATIONS

Chinese Office Action dated May 4, 2017 issued in Japanese Patent Application No. 201510252902.9 (with English translation).

*Primary Examiner* — Hoa C Nguyen
*Assistant Examiner* — Stanley Tso
(74) *Attorney, Agent, or Firm* — McDermott Will & Emery LLP

(57) ABSTRACT

A resistance assembly for a mobile device and a manufacturing method thereof are disclosed. The resistance assembly for a mobile device in accordance with an aspect of the present invention includes: a substrate having a circuit formed thereon; first to fourth pads laminated and separated from one another on the substrate; first to fourth terminals connected to the first to fourth pads, respectively, by being formed in a longitudinal direction along edges of lateral surfaces of a resistance body that are opposite to each other; and first and second resistors formed in between the first to fourth terminals along the opposite lateral and connected in parallel to each other on the resistance body and configured to adjust electric current flowed into the circuit.

4 Claims, 7 Drawing Sheets

(51) Int. Cl.
*H05K 3/30* (2006.01)
*H01C 1/012* (2006.01)
*H01C 1/14* (2006.01)
*H01C 17/00* (2006.01)
*H01C 17/28* (2006.01)
*H01C 1/028* (2006.01)

(52) U.S. Cl.
CPC ............ *H01C 17/281* (2013.01); *H05K 1/111* (2013.01); *H05K 3/30* (2013.01); *H01C 1/028* (2013.01); *H05K 2201/10022* (2013.01); *Y10T 29/49103* (2015.01)

(58) Field of Classification Search
USPC .......................................................... 174/260
See application file for complete search history.

(56) References Cited

U.S. PATENT DOCUMENTS

| | | | |
|---|---|---|---|
| 9,257,230 B2* | 2/2016 | Park | H01G 2/14 |
| 2004/0113750 A1 | 6/2004 | Matsukawa et al. | |
| 2009/0139757 A1* | 6/2009 | Lee | H01G 4/005 |
| | | | 174/260 |
| 2011/0057767 A1 | 3/2011 | Ryu et al. | |
| 2011/0094782 A1* | 4/2011 | Zhou | H05K 1/0253 |
| | | | 174/260 |
| 2015/0116892 A1* | 4/2015 | Park | H01G 4/40 |
| | | | 361/275.3 |
| 2016/0050760 A1* | 2/2016 | Tamagawa | H01C 1/012 |
| | | | 361/752 |

* cited by examiner

FIG. 5
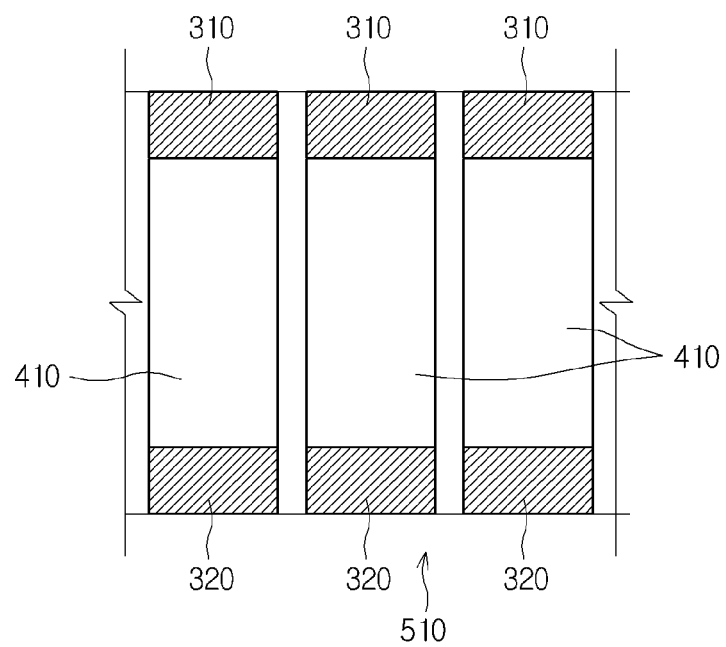
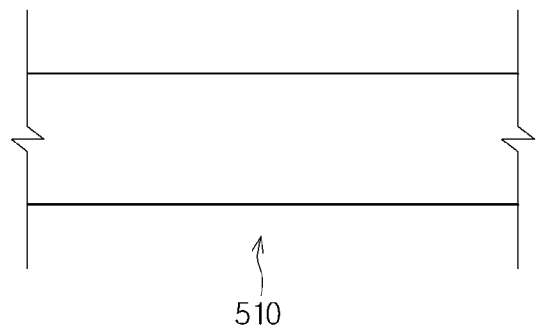

RESISTANCE ASSEMBLY FOR MOBILE DEVICE AND MANUFACTURING METHOD THEREOF

CROSS-REFERENCE TO RELATED APPLICATIONS

This application claims the benefit of Korean Patent Application No. 10-2014-0059832, filed with the Korean Intellectual Property Office on May 19, 2014, the disclosure of which is incorporated herein by reference in its entirety.

BACKGROUND

1. Technical Field

The present invention relates to a resistance assembly for a mobile device and a manufacturing method thereof.

2. Background Art

Among various cases of using resistance in a circuit, the circuit is sometimes designed to have its operation assisted by adjusting a current of a power. In this kind of circuit design, if the resistance is damaged and faulted (i.e., shorted) by an external shock (e.g., surge, static electricity, etc.), all of the current of the power may be flowed into the integrated circuit, possibly causing a secondary damage to the circuit.

Contemplated to prevent this kind of phenomenon is designing the circuit with a plurality of resistance or designing the circuit with an array type of resistance. However, this kind of circuit design will inevitably increase the use of space by a substrate.

Particularly, as mobile devices are increasingly smaller and more precise, increasing the substrate space for the stability of circuit as described above would not be very preferable, and thus studies are demanded for a resistance assembly that can adjust the current flowed in the circuit more effectively.

The related art of the present invention is disclosed in Korea Patent Publication No. 10-2013-0070682 (laid open on Jun. 28, 2013).

SUMMARY

The present invention provides a resistance assembly for a mobile device and a manufacturing method thereof that can effectively adjust a current flowed into a circuit.

An aspect of the present invention provides a resistance assembly for a mobile device that includes: a substrate having a circuit formed thereon; first to fourth pads laminated and separated from one another on the substrate; first to fourth terminals connected to the first to fourth pads, respectively, by being formed in a longitudinal direction along edges of lateral surfaces of a resistance body that are opposite to each other; and first and second resistors formed in between the first to fourth terminals along the opposite lateral and connected in parallel to each other on the resistance body and configured to adjust electric current flowed into the circuit.

The first to fourth terminals can be each extended along an edge of a surface of the resistance body that faces the substrate.

The first and second resistors can have a protective layer formed on surfaces thereof so as to protect portions of the first and second resistors that are exposed in between the first to fourth terminals.

Another aspect of the present invention provides a method of manufacturing a resistance assembly for a mobile device that includes: preparing a parallel resistance body having a plurality of resistance bodies formed therein, the plurality of resistance bodies arranged in parallel with each other; forming a first terminal and a second terminal on one surface of the parallel resistance body so as to correspond to the resistance bodies, respectively; forming a first resistor in between the first and second terminals so as to correspond to each of the resistance bodies; forming a third terminal and a fourth terminal on the other surface of the parallel resistance body so as to correspond to the resistance bodies, respectively; forming a second resistor in between the third and fourth terminals so as to correspond to each of the resistance bodies; dividing the parallel resistance body so as to correspond to the resistance bodies, respectively; and connecting the first to fourth terminals individually to the first to fourth pads, respectively, which are laminated and separated from one another on a substrate, by installing the resistance bodies on the substrate in such a way that surfaces having the first and second resistors formed thereon are arranged orthogonally to the substrate.

The method can further include, prior to the dividing of the parallel resistance body, forming dividing grooves in between the resistance bodies; and extending the first to fourth terminals in the dividing grooves, respectively.

The first and second resistors can have a protective layer formed on surfaces thereof so as to protect portions of the first and second resistors that are exposed in between the first to fourth terminals.

BRIEF DESCRIPTION OF THE DRAWINGS

FIG. 5, FIG. 6, FIG. 7 and FIG. 8 show top and cross-sectional states of a parallel resistance body at main steps of the method of manufacturing a resistance assembly for a mobile device in accordance with an embodiment of the present invention.

DETAILED DESCRIPTION

Figure 1:
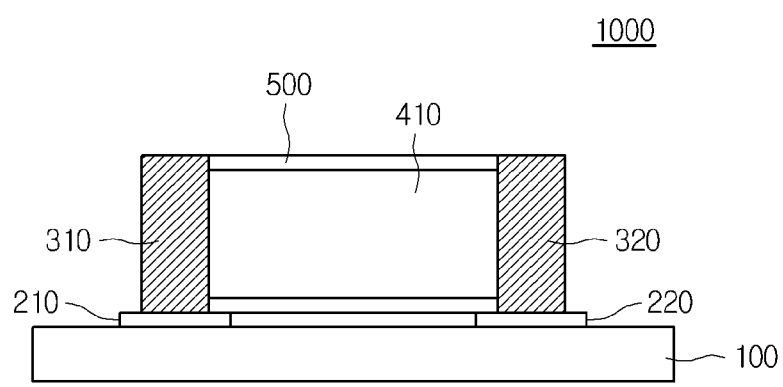
FIG. 1 is a front view briefly showing a resistance assembly for a mobile device in accordance with an embodiment of the present invention.

Hereinafter, certain embodiments of a resistance assembly for a mobile device and a manufacturing method thereof in accordance with the present invention will be described in detail with reference to the accompanying drawings. In describing the present invention with reference to the accompanying drawings, any identical or corresponding elements will be assigned with same reference numerals, and no redundant description thereof will be provided.

Terms such as "first" and "second" can be used in merely distinguishing one element from other identical or corresponding elements, but the above elements shall not be restricted to the above terms.

When one element is described to be "coupled" to another element, it does not refer to a physical, direct contact between these elements only, but it shall also include the possibility of yet another element being interposed between these elements and each of these elements being in contact with said yet another element.

Figure 3:
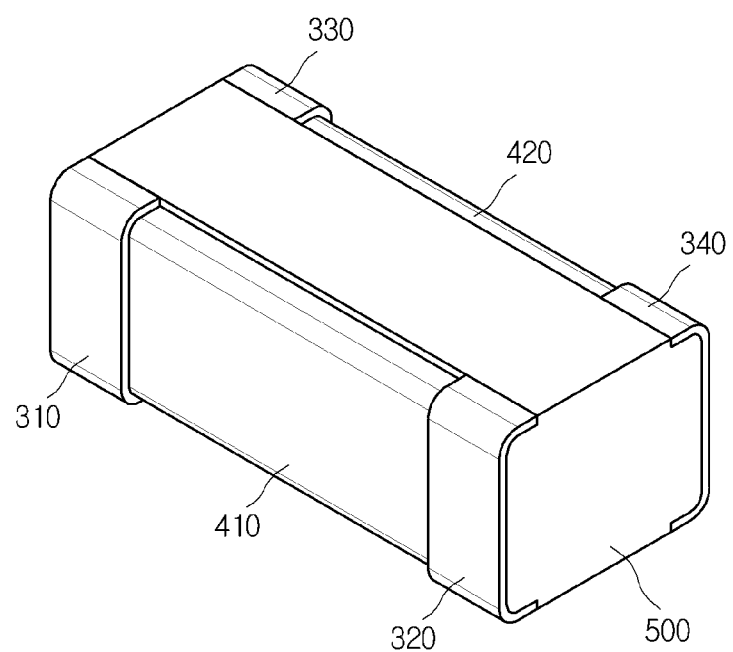
FIG. 3 shows details of terminals and resistors in the resistance assembly for a mobile device in accordance with an embodiment of the present invention.

FIG. 1 is a front view briefly showing a resistance assembly for a mobile device in accordance with an embodiment of the present invention. FIG. 1 is a top view briefly showing the resistance assembly for a mobile device in accordance with an embodiment of the present invention. FIG. 3 shows details of terminals and resistors in the resistance assembly for a mobile device in accordance with an embodiment of the present invention.

Figure 2:
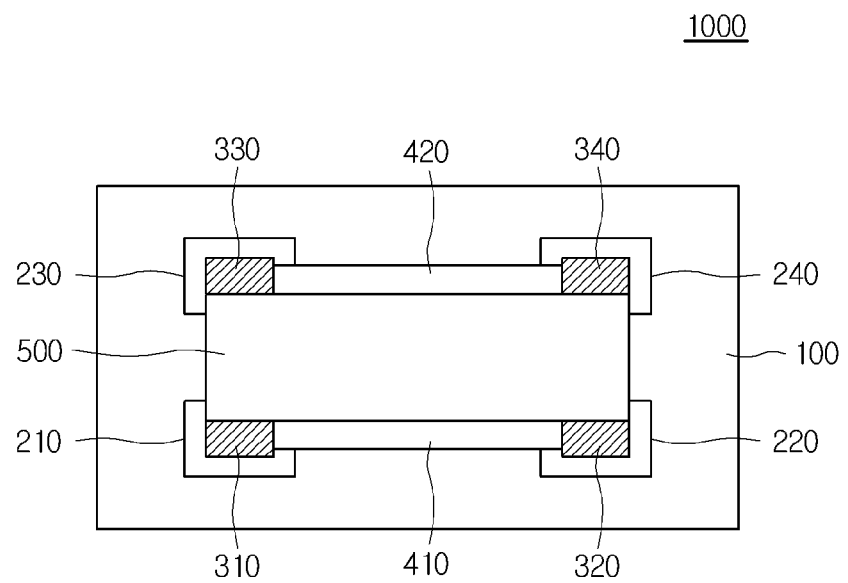
FIG. 2 is a top view briefly showing the resistance assembly for a mobile device in accordance with an embodiment of the present invention.

As illustrated in FIG. 1 to FIG. 3, a resistance assembly 1000 for a mobile device in accordance with an embodiment of the present invention includes a substrate 100, a first pad 210, a second pad 220, a third pad 230, a fourth pad 240, a first terminal 310, a second terminal 320, a third terminal 330, a fourth terminal 340, a first resistor 410 and a second resistor 420.

The substrate 1000, where a circuit is formed, has an integrated circuit (IC) formed thereon for specific operation or control of a mobile device and can have an electric current supplied thereto from an individual power source.

In such a case, the substrate 100 can include a variety of wired lines or further include different kinds of semiconductor devices, such as a transistor. Moreover, the substrate 100 can be constituted in various ways as necessary by, for example, including a conductive layer or a dielectric layer.

The first to fourth pads 210, 220, 230, 240 are laminated on the substrate 100 but are separated from one another, and the first to fourth terminals 310, 320, 330, 3430 are connected to the first to fourth pads 210, 220, 230, 240, respectively, and include a conductive material and thus can electrically connect the first and second resistors 410, 420 to a circuit formed on the substrate 100.

By connecting the first to fourth terminals 310, 320, 330, 340 to the first to fourth pads 210, 220, 230, 240, respectively, as shown in FIG. 1 and FIG. 2, the first to fourth pads 210, 220, 230, 240 can be electrically connected to the first to fourth terminals 310, 320, 330, 340, respectively, and then to the circuit formed on the substrate 100, thereby allowing the first and second resistors 410, 420 formed in between the first to fourth terminals 310, 320, 330, 340 to be connected to the circuit.

The first to fourth terminals 310, 320, 330, 340 are each formed in a longitudinal direction along a lateral surface edge of a resistance body 500 that faces another lateral surface edge of the resistance body 500. In such a case, the resistance body 500 can be made of, for example, an aluminum substrate in order to support the first to fourth terminals 310, 320, 330, 340 and the first and second resistors 410, 420.

For example, as illustrated in FIG. 1 to FIG. 3, the resistance body 500 can be formed in the shape of a cuboid, and the first to fourth terminals 310, 320, 330, 340 can be formed in a longitudinal direction on relatively longer lateral surfaces of the resistance body 500 that face one another.

The first and second resistors 410, 420 are formed in between the first to fourth terminals 310, 320, 330, 340 along the opposite lateral surfaces on the resistance body 500, and are connected in parallel with each other to adjust the current flowed to the circuit. The resistance body 500 can be formed in the substrate 100 in such a way that planes having the first and second resistors 410, 420 formed thereon are arranged orthogonally to the substrate 100.

That is, as shown in FIG. 1 to FIG. 3, the first resistor 410 can be formed in between the first terminal 310 and the second terminal 320 and arranged on one lateral surface of the resistance body 500, and the second resistor 420 can be formed in between the third terminal 330 and the fourth terminal 340 and arranged on a lateral surface that is opposite to the one lateral surface on which the first resistor 410 is formed.

The circuit formed on the substrate 100 as described above can use a resistor in order to adjust the electric current, and two or more resistors or an array of resistors can be used in order to prevent the circuit from being damaged by a damage to the resistor caused by an external impact (e.g., surge, static electricity, etc.).

In such a case, if two of stand-alone resistors are used, each stand-alone resistor formed by disposing one resistor in between a pair of terminals, more space is required due to the installation of two resistors, making it disadvantageous for realizing a smaller and more precise mobile device.

Moreover, if an array of resistors, in which two pairs of terminals are formed in a parallel form and a resistor is disposed between each pair of terminals, are used, the terminals need to be sufficiently separated in order to prevent a short-circuit between the terminals, also making it disadvantageous for realizing a smaller and more precise mobile device.

Accordingly, since the resistance assembly 1000 for a mobile device in accordance with the present embodiment can allow the first and second resistors 410, 420 to be connected in parallel with each other along the opposite lateral surfaces of the resistance body 500, the current flowing in the circuit can be controlled more effectively.

That is, since the first and second resistors 410, 420 are arranged on the lateral surfaces of the resistance body, increasing the size of the first and second resistors 410, 420 is irrelevant to use of space on the substrate 100, and thus available electric power can be increased and the heat-dissipation of the resistor can be improved.

Moreover, since the first and second resistors 410, 420 can be trimmed from the top, minimizing a current path, an installation error by an external electrode can be reduced for a lower resistance value than a conventional array of resistors.

Moreover, the installation reliability can be improved because the number of terminals can be relatively increased compared to conventional products.

In the resistance assembly 1000 for a mobile device in accordance with the present embodiment, the first to fourth terminals 310, 320, 330, 340 can be extended along edges of a surface facing the substrate 100 on the resistance body 500.

Specifically, as shown in FIG. 1 to FIG. 3, the first to fourth terminals 310, 320, 330, 340 can be extended to the surface being in contact with the first to fourth pads 210, 220, 230, 240 on the resistance body 500.

In the case of arranging the first to fourth terminals 310, 320, 330, 340 and the resistors 410, 420 on lateral surfaces of the resistance body 500, adhesive strength may be relatively deteriorated after completing an SMT (Surface Mounter Technology) process.

Therefore, in the resistance assembly 1000 for a mobile device in accordance with the present embodiment, the first to fourth terminals 310, 320, 330, 340 are each extended along an edge of the surface of the resistance body 500 facing the substrate 100 to prevent the deterioration of adhesive force with the first to fourth pads 210, 220, 230, 240.

In the resistance assembly 1000 for a mobile device in accordance with the present embodiment, a protective layer can be formed on surfaces of the first and the second resistors 410, 420 so as to protect portions of the first and second resistors 410, 420 that are exposed in between the first to fourth terminals 310, 320, 330, 340.

In such a case, the protective layer is a kind of a film that is coated on surfaces of the first and second resistors 410, 420 so as to protect the exposed portions of the first and second resistors 410, 420 from oxidation and can be variably constituted, as necessary, by including an anti-corrosive material.

Accordingly, the resistance assembly 1000 for a mobile device in accordance with the present embodiment can minimize a damage to the first and second resistors 410, 420 to realize an improved durability and optimal performance of the resistance assembly 1000 for a mobile device.

Figure 4:
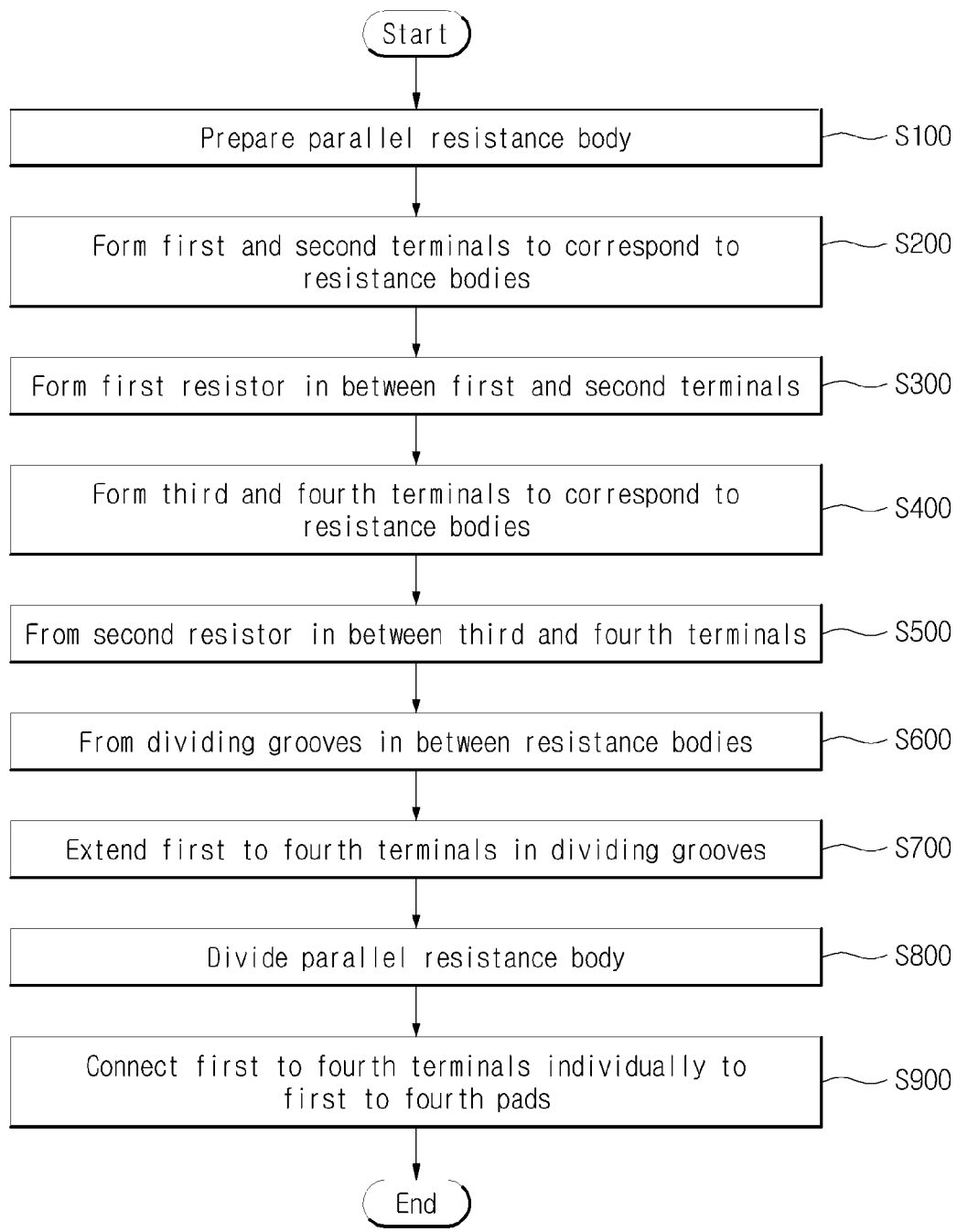
FIG. 4 is a flow diagram showing a method of manufacturing a resistance assembly for a mobile device in accordance with an embodiment of the present invention.

FIG. 4 is a flow diagram showing a method of manufacturing a resistance assembly for a mobile device in accordance with an embodiment of the present invention. FIG. 5, FIG. 6, FIG. 7 and FIG. 8 show top and cross-sectional states of a parallel resistance body at main steps of the method of manufacturing a resistance assembly for a mobile device in accordance with an embodiment of the present invention.

Here, for the convenience of description, elements used to describe the method of manufacturing a resistance assembly for a mobile device in accordance with an embodiment of the present invention will be described with reference to FIG. 1 to FIG. 3.

As illustrated in FIG. 4 to FIG. 8, the method of manufacturing a resistance assembly for a mobile device in accordance with an embodiment of the present invention can start with preparing a parallel resistance body 510 having a plurality of resistance bodies 500, which are arranged in parallel with one another, integrally formed therein (S100, FIG. 5).

That is, the resistance assembly 1000 for a mobile device in accordance with the present embodiment can be manufactured by use of the parallel resistance body 510 having the plurality of resistance bodies 500 arranged in parallel in a lengthwise direction and formed integrally therein.

Next, first and second terminals 310, 320 can be formed on one surface of the parallel resistance body 510 to correspond to each of the resistance bodies 500 (S200, FIG. 5). That is, as shown in FIG. 5, the first and second terminals 310, 320 corresponding, respectively, to widths of the resistance bodies 500 can be formed on one surface of the parallel resistance body 510.

Then, a first resistor 410 can be formed in between the first and second terminals 310, 320 so as to correspond to each of the resistance bodies 500 (S300, FIG. 5).

Then, third and fourth terminals 330, 340 can be formed on the other surface of the parallel resistance body 510 to correspond to each of the resistance bodies 500 (S400). That is, the third and fourth terminals 330, 340 corresponding, respectively, to the widths of the resistance bodies 500 can be formed on the other surface of the parallel resistance body 510

Here, the third and fourth terminals 330, 340 can be formed through the same steps as the first and second terminals 310, 320.

Then, a second resistor 420 can be formed in between the third and fourth terminals 330, 340 so as to correspond to each of the resistance bodies 500 (S500). In this case as well, the second resistor 420 can be formed through the same steps as the first resistor 410.

Figure 8:
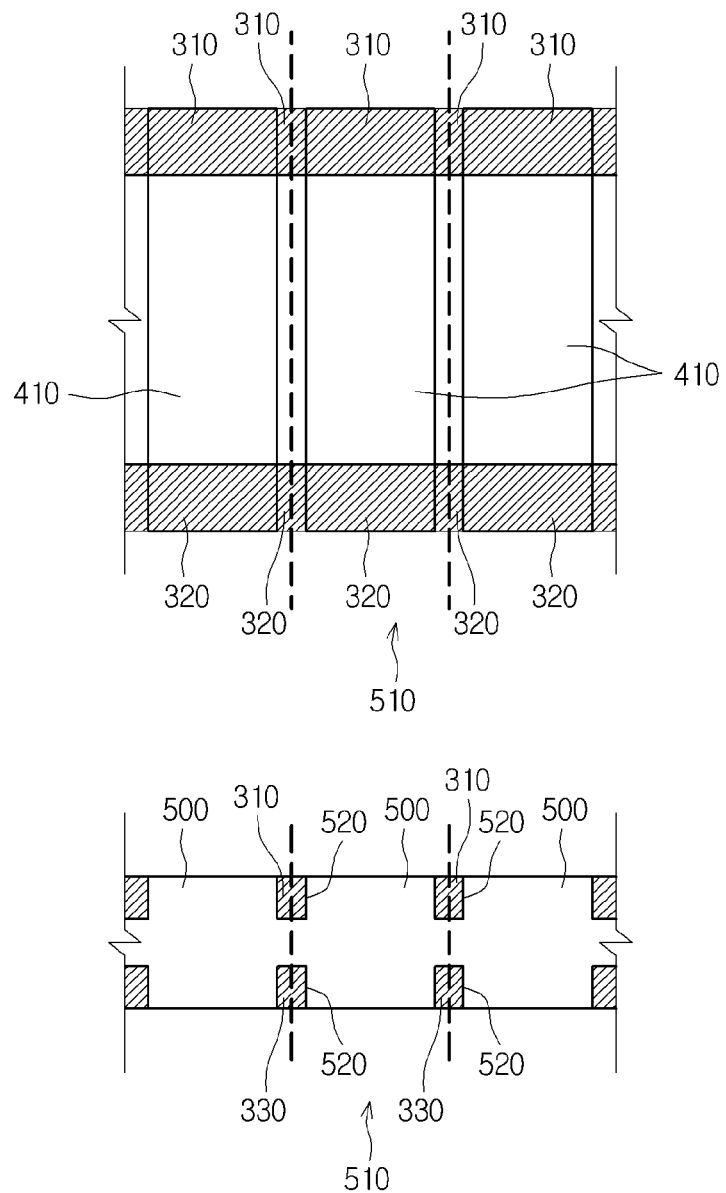

Afterwards, the parallel resistance body 510 can be divided so as to correspond to the plurality of resistance bodies 500 (S800, FIG. 8). That is, the plurality of resistance bodies 500 can be generated by dividing the parallel resistance body 510.

Thereafter, by installing the resistance bodies 500 on the substrate 100 in such a way that surfaces on which the first and second resistors 410, 420 are formed, respectively, are arranged orthogonally to the substrate 100, the first to fourth terminals 310, 320, 330, 340 can be individually connected to first to fourth pads 210, 220, 230, 240, respectively, which are laminated and separated from one another on the substrate 100.

Through this, the first to fourth pads 210, 220, 230, 240 can be electrically connected to the first to fourth terminals 310, 320, 330, 340, respectively, and then electrically connected to a circuit formed on the substrate 100, thereby allowing the first and second resistors 410, 420 formed in between the first to fourth terminals 310, 320, 330, 340 to be connected to the circuit.

As such, in the method of manufacturing a resistance assembly for a mobile device in accordance with the present embodiment, since the first and second resistors 410, 420 are connected in parallel with each other along the opposite lateral surfaces on the resistance body 500, the electric current flowed to the circuit can be adjusted more effectively.

Particularly, the plurality of resistance bodies 500, having the first to fourth terminals 310, 320, 330, 340 and the first and second resistors 410, 420 formed on the lateral surfaces thereof, can be manufactured more readily.

Figure 6:
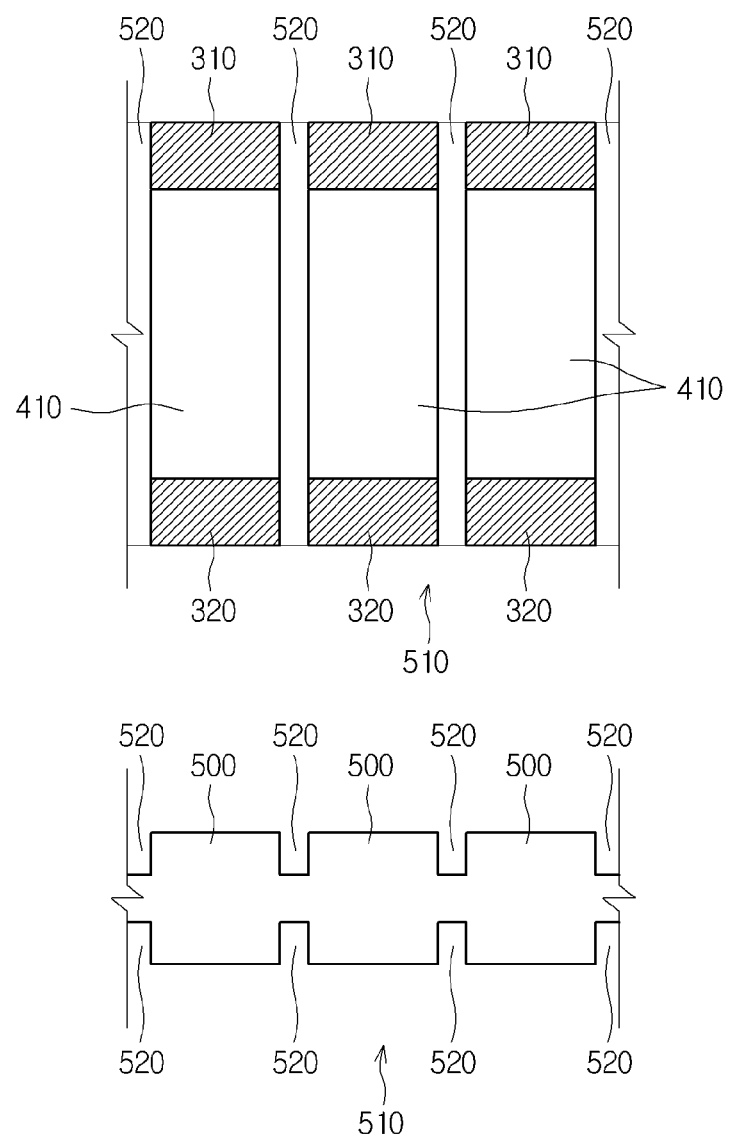
Figure 7:
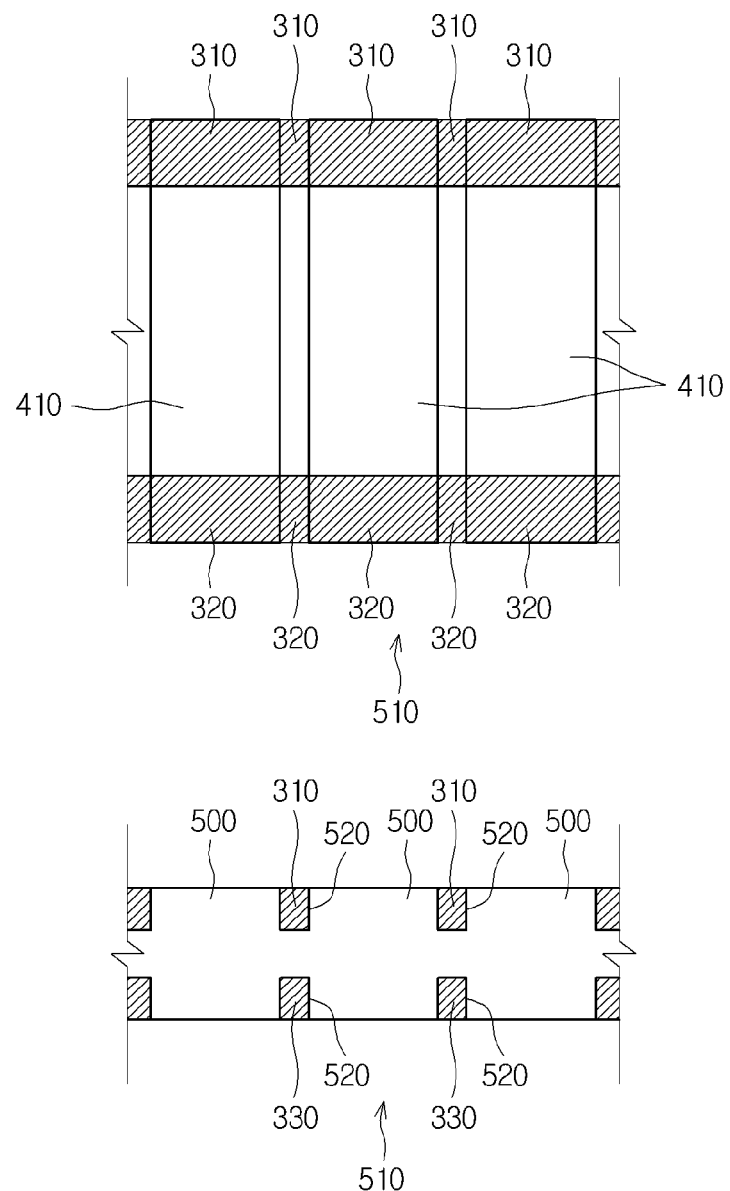

The method of manufacturing a resistance assembly for a mobile device in accordance with the present embodiment can further include, prior to step S800, forming dividing grooves 520 in between the resistance bodies 500 (S600, FIG. 6). Here, the dividing grooves 520 can be formed on one surface and the other surface of the parallel resistance body 510 by way of, for example, laser processing.

Thereafter, the first to fourth terminals 310, 320, 330, 340 can be extended, respectively, to the dividing groove 520. Specifically, since the dividing grooves 520 are formed by being bent from the one surface and the other surface of the parallel resistance body 510 on which the first to fourth terminals 310, 320, 330, 340 are formed, the first to fourth terminals 310, 320, 330, 340 can be extended by forming electrodes in these dividing grooves 520.

Accordingly, in the method of manufacturing a resistance assembly for a mobile device in accordance with the present embodiment, when installing each of the resistance bodies 500 on the substrate 100, the first to fourth terminals 310, 320, 330, 340 are each extended along an edge of the surface of the resistance body 500 facing the substrate 100 to prevent the deterioration of adhesive force with the first to fourth pads 210, 220, 230, 240.

In the method of manufacturing a resistance assembly for a mobile device in accordance with the present embodiment, a protective layer can be formed on surfaces of the first and the second resistors 410, 420 so as to protect portions of the first and second resistors 410, 420 that are exposed in between the first to fourth terminals 310, 320, 330, 340.

Accordingly, the method of manufacturing a resistance assembly for a mobile device in accordance with the present embodiment can minimize a damage to the first and second resistors 410, 420 to realize an improved durability and optimal performance.

Although certain embodiments of the present invention have been described hitherto, it shall be appreciated that the present invention can be variously modified and permutated by those of ordinary skill in the art to which the present invention pertains by supplementing, modifying, deleting and/or adding an element without departing from the technical ideas of the present invention, which shall be defined by the claims appended below. It shall be also appreciated that such modification and/or permutation are also included in the claimed scope of the present invention.

What is claimed is:

1. A resistance assembly for a mobile device, comprising:
a substrate having a circuit formed thereon;
first, second, third and fourth pads laminated and separated from one another on the substrate;
first, second, third and fourth terminals connected to the first, second, third and fourth pads, respectively, extending in a longitudinal direction along edges of lateral surfaces of a resistance body that are opposite to each other; and
a first resistor formed in between the first and second terminals, and a second resistor formed in between the third and fourth terminals and the first resistor and the second resistor are connected in parallel to each other and configured to adjust electric current flowed into the circuit,
wherein the first resistor is formed on a first lateral surface of the resistance body and the second resistor is formed on a second lateral surface of the resistance body,
the first and second lateral surfaces are orthogonal to the substrate,
a length of each of the first, second, third and fourth terminals in a length direction of the resistance body is greater than a width of each of the first, second, third and fourth terminals in a width direction of the resistance body, respectively,
wherein the resistance body is a rectangular, cuboid shape comprising a first side surface, a second side surface, a top surface and a bottom surface,
wherein the first and second side surfaces do not share a common edge and the top and bottom surfaces do not share a common edge,
wherein each of the first, second, third and fourth terminals are in contact with two corners of the resistance body,
wherein the first resistor is formed on the first side surface and portions of the top and bottom surfaces, and the second resistor is formed on the second side surface and different portions of the top and bottom surfaces,
wherein each of the first and second resistors is substantially rectangular-shaped,
wherein each of the first and second side surfaces comprises dividing grooves, and
wherein the first, second, third and fourth terminals extend into each of the respective dividing grooves.

2. The resistance assembly of claim 1, wherein the first, second, third and fourth terminals are each extended along an edge of a surface of the resistance body that faces the substrate.

3. The resistance assembly of claim 2, wherein the first and second resistors have a protective layer formed on surfaces thereof so as to protect portions of the first and second resistors that are exposed in between the first, second, third and fourth terminals.

4. The resistance assembly of claim 1, wherein the first and second resistors have a protective layer formed on surfaces thereof so as to protect portions of the first and second resistors that are exposed in between the first, second, third and fourth terminals.

* * * * *